United States Patent
Ueda et al.

(10) Patent No.: US 6,919,267 B2
(45) Date of Patent: *Jul. 19, 2005

(54) METHOD FOR FORMING WIRING STRUCTURE

(75) Inventors: Tetsuya Ueda, Osaka (JP); Masashi Hamanaka, Nara (JP); Takeshi Harada, Niigata (JP); Hideaki Yoshida, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 110 days.

This patent is subject to a terminal disclaimer.

(21) Appl. No.: 10/328,175

(22) Filed: Dec. 26, 2002

(65) Prior Publication Data

US 2004/0009653 A1 Jan. 15, 2004

(30) Foreign Application Priority Data

Dec. 27, 2001 (JP) ........................................ 2001-396420

(51) Int. Cl.⁷ .......................................... H01L 21/4763
(52) U.S. Cl. ........................ 438/626; 438/627; 438/629
(58) Field of Search ................................ 438/626, 627, 438/629, 631, 633, 636, 637, 638, 643, 645, 648, 653, 656, 672, 687, 692, 700, 906, 952, 959

(56) References Cited

U.S. PATENT DOCUMENTS

| | | | |
|---|---|---|---|
| 6,150,269 A | 11/2000 | Roy | |
| 6,174,810 B1 | 1/2001 | Islam et al. | |
| 6,184,128 B1 | 2/2001 | Wang et al. | |
| 6,274,478 B1 | 8/2001 | Farkas et al. | |
| 6,274,499 B1 | 8/2001 | Gupta et al. | |
| 6,358,849 B1 | 3/2002 | Havemann et al. | |
| 6,444,569 B2 | 9/2002 | Farkas et al. | |
| 6,468,135 B1 | 10/2002 | Cruz et al. | |
| 6,573,173 B2 | 6/2003 | Farkas et al. | |
| 6,759,322 B2 * | 7/2004 | Yoshida et al. | 438/626 |
| 2002/0102834 A1 | 8/2002 | Yang | |
| 2003/0216019 A1 * | 11/2003 | Hamanaka et al. | 438/587 |

FOREIGN PATENT DOCUMENTS

| | | |
|---|---|---|
| JP | 7-221058 | 8/1995 |
| JP | 9-326392 A | 12/1997 |
| JP | 10-214834 A | 8/1998 |
| JP | 2000-340531 A | 12/2000 |
| JP | 2001-85375 | 3/2001 |
| JP | 2001-148366 | 5/2001 |
| JP | 2001 156029 A | 6/2001 |
| JP | 2001-162520 | 6/2001 |
| JP | 2001-291720 | 10/2001 |
| JP | 2002-506295 | 2/2002 |
| JP | 2002-110679 | 4/2002 |
| JP | 2003-77918 | 3/2003 |
| JP | 2003-77921 | 3/2003 |
| JP | 2003-100746 | 4/2003 |
| WO | WO 99/46353 | 9/1999 |

* cited by examiner

Primary Examiner—Hoai Pham
(74) Attorney, Agent, or Firm—McDermott Will & Emery LLP

(57) ABSTRACT

After a plurality of grooves are formed in an insulating film and in an anti-reflection film on the insulating film, a barrier metal film and a conductive film are deposited on the anti-reflection film such that each of the grooves is filled therewith. Subsequently, the portions of the conductive film outside the grooves are removed by polishing and then the portions of the barrier metal film outside the grooves are removed by polishing. Thereafter, respective foreign matters adhered to a polishing pad and to a surface to be polished during polishing are removed and then a surface of the anti-reflection film is polished.

15 Claims, 11 Drawing Sheets

METHOD FOR FORMING WIRING STRUCTURE

BACKGROUND OF THE INVENTION

The present invention relates to a method for forming a wiring structure in a semiconductor device.

As a conventional method for forming a wiring structure, there has been used one disclosed in, e.g., Japanese Laid-Open Patent Publication No. HEI 10-214834. Referring to the drawings, the conventional method for forming a wiring structure will be described by using, as an example, the case where plugs are formed in holes formed in an insulating film.

FIGS. 10A to 10C are cross-sectional views illustrating the individual process steps of the conventional method for forming a wiring structure.

First, as shown in FIG. 10A, a silicon dioxide film 12 having a thickness of about 1 μm is deposited as an insulating film on a silicon substrate 11. Then, holes 13 each having a diameter of about 0.8 μm are formed by lithography and dry etching in specified regions of the silicon dioxide film 12 to extend therethrough.

Next, a titanium film 14 having a thickness of 30 nm and serving as a lower-layer conductive film and a titanium nitride film 15 having a thickness of 100 nm and serving as an interlayer conductive film are deposited successively by PVD (physical vapor deposition) over the entire surface of the silicon dioxide film 12 including the holes 13. Thereafter, a tungsten film 16 having a thickness of 1 μm and serving as an upper-layer conductive film is deposited by CVD (chemical vapor deposition) over the entire surface of the titanium nitride film 15, whereby a conductive film having a three-layer structure is deposited. In the three-layer conductive film, each of the titanium film 14 and the titanium nitride film 15 is a barrier metal.

Next, the respective portions of the tungsten film 16 and the titanium nitride film 15 deposited on regions outside the holes 13 are removed by chemical mechanical polishing (CMP) using an abrasive agent, as shown in FIG. 10B. This completely exposes the portions of the titanium film 14 deposited on the regions outside the holes 13.

Next, the portions of the titanium film 14 deposited on the regions outside the holes 13 are removed by CMP using another abrasive agent, as shown in FIG. 10C. This forms plugs 17 composed of tungsten in the holes 13 and exposes the silicon dioxide film 12.

Although the formation of tungsten plugs has been described above by way of example, it is also possible to form, e.g., copper wires in wiring grooves formed in an insulating film by the same method.

With the scaling down of a wiring pattern, the spacing between adjacent wires (wire-to-wire spacing) has been reduced increasingly so that an anti-reflection layer (hereinafter referred to as ARL) has been used in a lithographic step for forming wiring grooves, via holes, and the like.

However, the formation of wires using an ARL film based on the foregoing conventional method for forming a wiring structure has the problem that a short circuit occurs between wires.

SUMMARY OF THE INVENTION

It is therefore an object of the present invention to prevent a short circuit between wires buried in an insulating film and in an ARL film on the insulating film.

To attain the object, the present inventors have examined causes for the short circuit occurring between the wires in the conventional method for forming a wiring structure and made the following finding.

In forming wires in accordance with the conventional method for forming a wiring structure, a barrier metal under polishing locally peels off to form a foreign matter. Since the foreign matter is hard, if an ARL film composed of a material more fragile than an insulating film present between wires has been formed on the insulating film, the foreign matter causes a microcrack in a surface of the ARL film. In the case where the microcrack extends from one wire to another wire adjacent thereto, if a metal (the barrier metal or a conductive film) is buried in the microcrack during the formation of wiring, a short circuit occurs between the wires.

Since the spacing between wires is reduced as the wiring structure is scaled down, the microcrack mentioned above is more likely to extend between the adjacent wires so that the metal buried in the microcrack is more likely to form a pseudocross-linking structure between the wires. As a result, a short circuit is more likely to occur between the wires.

FIG. 11 is a plan view showing the metal buried in the microcrack caused in the ARL film between the wires. As shown in FIG. 11, a plurality of copper wires 22 are buried in an ARL film 21 in such a manner as to extend in parallel with each other. A crack 23 has been formed in the ARL film 21 between the copper wires 22 in such a manner as to extend therebetween. Copper was buried in the crack 23 during the formation of the copper wires 22 so that a short circuit occurs between the copper wires 22.

The present invention has been achieved in view of the foregoing finding. Specifically, a method for forming a wiring structure according to the present invention comprises: a groove forming step of forming an anti-reflection film on an insulating film and then forming, in each of the anti-reflection film and the insulating film, a first groove and a second groove adjacent to the first groove; a film depositing step of depositing a barrier metal film and a conductive film on the anti-reflection film such that each of the first and second grooves is filled therewith; a first polishing step of removing the portion of the conductive film outside the first and second grooves by polishing; a second polishing step of removing, after the first polishing step, the portion of the barrier metal film outside the first and second grooves by polishing; a foreign matter removing step of removing respective foreign matters adhered to a polishing pad and to a surface to be polished after the second polishing step therefrom; and a third polishing step of polishing, after the foreign matter removing step, a surface of the anti-reflection film.

In the method for forming a wiring structure according to the present invention, the barrier metal film and the conductive film are buried in the grooves formed in the insulating film and in the anti-reflection film on the insulating film and then the respective portions of the conductive film and the barrier metal film outside the grooves are removed by polishing. Thereafter, the foreign matter adhered to the surface to be polished during polishing is removed and then the surface of the anti-reflection film is polished. This achieves the following effects if a microcrack is formed in the surface of the anti-reflection film present between the grooves (i.e., between wires) during the polishing of the barrier metal film and a metal is buried in the microcrack. Since final polishing is performed with respect to the surface of the anti-reflection film after the foreign matter adhered to the surface to be polished during the polishing of the barrier metal film or the like is removed therefrom, it is possible to remove the metal buried in the microcrack, while preventing new damage caused by the foreign matter to the surface of the anti-reflection film. This allows the situation in which the metal buried in the microcrack causes cross-linking between the wires to be circumvented and thereby reduces the frequency of short circuits occurring between the wires. As a result, high-performance wiring can be formed.

In addition, the method for forming a wiring structure according to the present invention performs the removal of the foreign matter adhered to the polishing pad used in the second polishing step (polishing of the barrier metal film) with the removal of the foreign matter adhered to the surface to be polished so that, if the polishing pad is used also in the third polishing step (polishing of the anti-reflection film), damage to the surface of the anti-reflection film is prevented more reliably. Since the respective foreign matters adhered to the surface to be polished and to the polishing pad are removed simultaneously, a time required to form wiring can be reduced by improving work efficiency.

In the method for forming a wiring structure according to the present invention, a pressure under which the surface to be polished is pressed onto a polishing pad and a rotating speed of the polishing pad in the third polishing step are preferably the same as in the second polishing step.

The arrangement allows easy setting of polishing conditions for the third polishing step so that work efficiency in the formation of wiring is improved and a reduction in process throughput is thereby prevented. If the polishing time is shorter in the third polishing step than in the second polishing step, the surface of the anti-reflection film is prevented from being significantly scraped off. If the foregoing pressure and rotating speed are lower in the third polishing step than in the first polishing step, the significant scraping-off of the surface of the anti-reflection film can be prevented more reliably.

In the method for forming a wiring structure according to the present invention, an abrasive agent used in the third polishing step is preferably the same as used in the second polishing step.

The arrangement prevents the conductive film buried in the grooves from being significantly polished in the third polishing step so that an increase in wiring resistance is prevented.

In the method for forming a wiring structure according to the present invention, each of the second polishing step, the foreign matter removing step, and the third polishing step is preferably performed by using the same polishing system and the foreign matter removing step preferably includes the step of rotating a polishing pad with the surface to be polished being pressed onto the polishing pad.

The arrangement allows each of the second polishing step, the foreign matter removing step, and the third polishing step to be performed continuously in the same polishing system without halting the system so that work efficiency in the formation of wiring is further improved. In this case, the foreign matter removing step preferably includes the step of supplying an organic acid, an organic alkali, or pure water onto the polishing pad in place of an abrasive agent. The arrangement ensures the removal of the foreign matters adhered to the surface to be polished and the polishing pad therefrom. In this case, if a rotating speed of the polishing pad is lower in the foreign matter removing step than in each of the second and third polishing steps or if a pressure under which the surface to be polished is pressed onto the polishing pad is lower in the foreign matter removing step than in each of the second and third polishing steps, it is possible to remove the foreign matters adhered to the surface to be polished and to the polishing pad therefrom, while suppressing the scraping-off of the conductive film and the like.

In the method for forming a wiring structure according to the present invention, if a spacing between the first and second grooves is 0.25 $\mu$m or less, the present invention more remarkably achieves the foregoing effects than the prior art.

In the method for forming a wiring structure according to the present invention, the first and second grooves may be arranged in parallel with each other.

In the method for forming a wiring structure according to the present invention, formation of wires in the first and second grooves may be performed by a dual damascene method.

In the method for forming a wiring structure according to the present invention, the anti-reflection film may be composed of a silicon containing material.

The arrangement ensures an improved accuracy with which a pattern is formed in a lithographic step for forming the grooves. If a KrF excimer laser beam (at a wavelength of 248 nm), e.g., is used as a light source in the lithographic step, a multilayer film consisting of a lower-layer SiON film having a thickness of 75 nm and an upper-layer $SiO_2$ film having a thickness of 8 nm exhibits a high absorption efficiency to the KrF excimer laser beam so that the multilayer film has excellent performance as an anti-reflection film. If a silicon compound is used as a material composing the anti-reflection film, equipment for forming a hole in the silicon dioxide film can be used commonly as equipment for forming a hole in the anti-reflection film, which achieves a reduction in fabrication cost for the semiconductor device.

In the method for forming a wiring structure according to the present invention, the conductive film is preferably a copper film and the barrier metal film is preferably a tantalum film, a tantalum nitride film, or a multilayer film composed of a tantalum film and a tantalum nitride film.

The arrangement allows the formation of low-resistance wiring. In this case, a wire formed in the first or second groove may be connected electrically to a plug formed under the wire.

DETAILED DESCRIPTION OF THE INVENTION

Embodiment 1

Figure 1A:
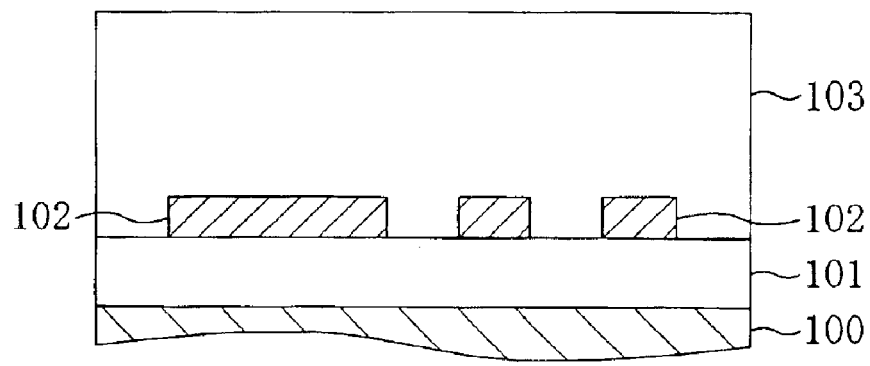
FIGS. 1A to 1C are cross-sectional views illustrating the individual process steps of a method for forming a wiring structure according to a first embodiment of the present invention.

Referring to the drawings, a description will be given herein below to a method for forming a wiring structure according to a first embodiment of the present invention.

FIGS. 1A to 1C, FIGS. 2A and 2B, FIGS. 3A and 3B, and FIG. 4 are cross-sectional views illustrating the individual process steps of the method for forming a wiring structure according to the first embodiment.

First, as shown in FIG. 1A, a first silicon dioxide film 101 is formed on a substrate 100 composed of, e.g., silicon. Then, lower-layer wires 102 each composed of, e.g., a tungsten film are formed on the first silicon dioxide film 101. Thereafter, a second silicon dioxide film 103 is deposited by, e.g., CVD over the upper surface of the first silicon dioxide film 101 including the upper surfaces of the lower-layer wires 102.

Figure 1B:
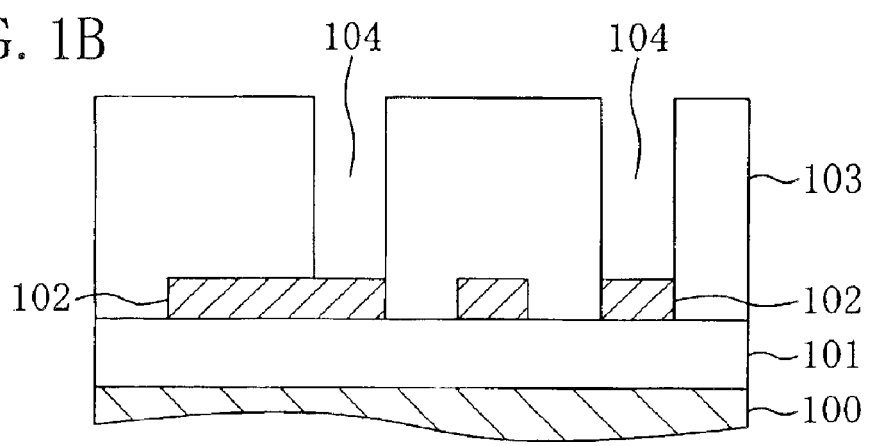

Next, as shown in FIG. 1B, via holes 104 reaching the lower-layer wires 102 are formed by lithography and dry etching in the second silicon dioxide film 103.

Figure 1C:
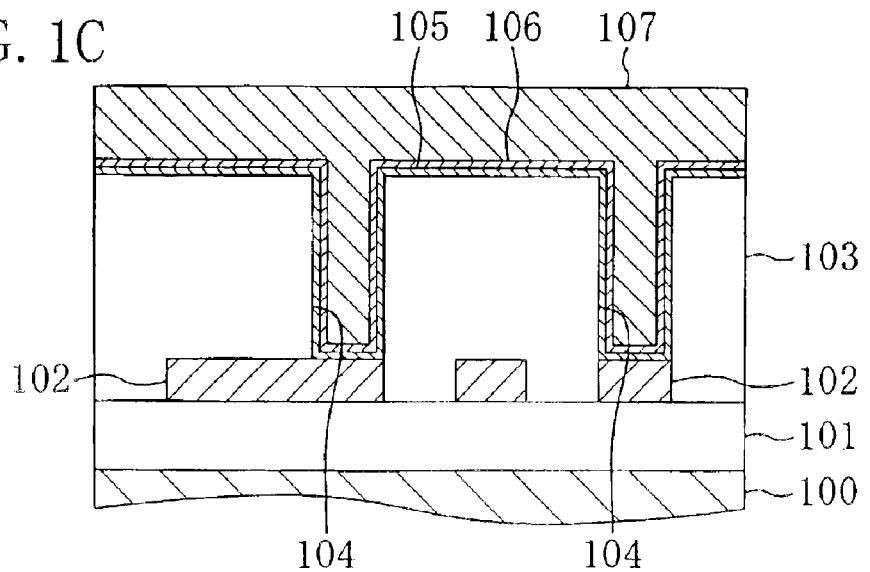

Next, as shown in FIG. 1C, a titanium (Ti) film 105 and a titanium nitride (TiN) film 106 are deposited successively by, PVD or CVD on the second silicon dioxide film 103 such that the via holes 104 are filled midway therewith. Then, a tungsten film 107 is formed by, e.g., CVD on the titanium nitride film 106 such that the via holes 104 are filled completely therewith. In the resulting structure, each of the titanium film 105 and the titanium nitride film 106 is a barrier metal.

Figure 2A:
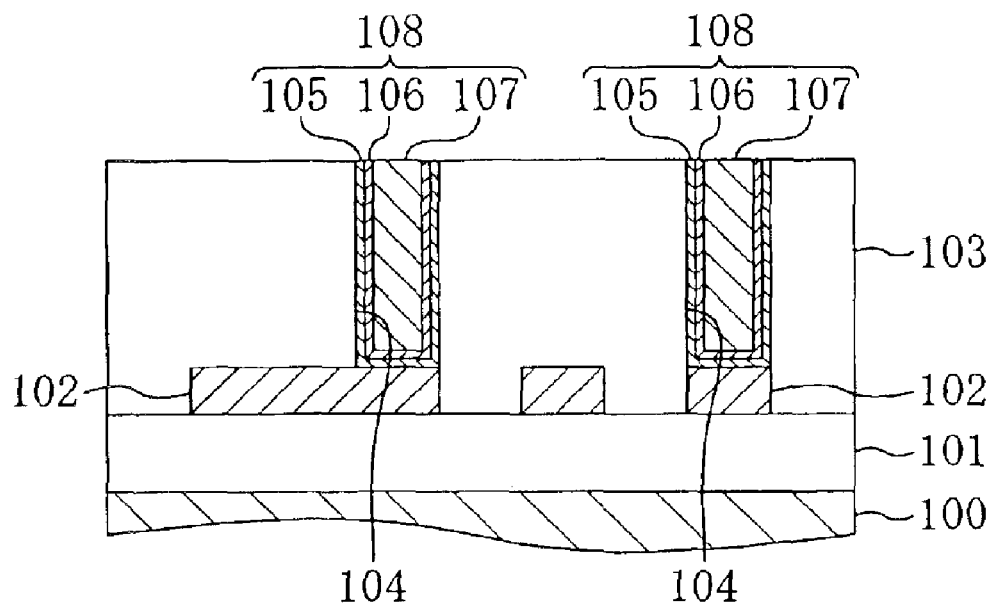
FIGS. 2A and 2B are cross-sectional views illustrating the individual process steps of the method for forming a wiring structure according to the first embodiment.

Next, as shown in FIG. 2A, the respective portions of the titanium film 105, the titanium nitride film 106, and the tungsten film 107 deposited on regions outside the via holes 104 are removed by, e.g., CMP. As a result, plugs 108 composed of tungsten which are protected reliably by the barrier metals are formed in the via holes 104 in the second silicon dioxide film 103.

Figure 2B:
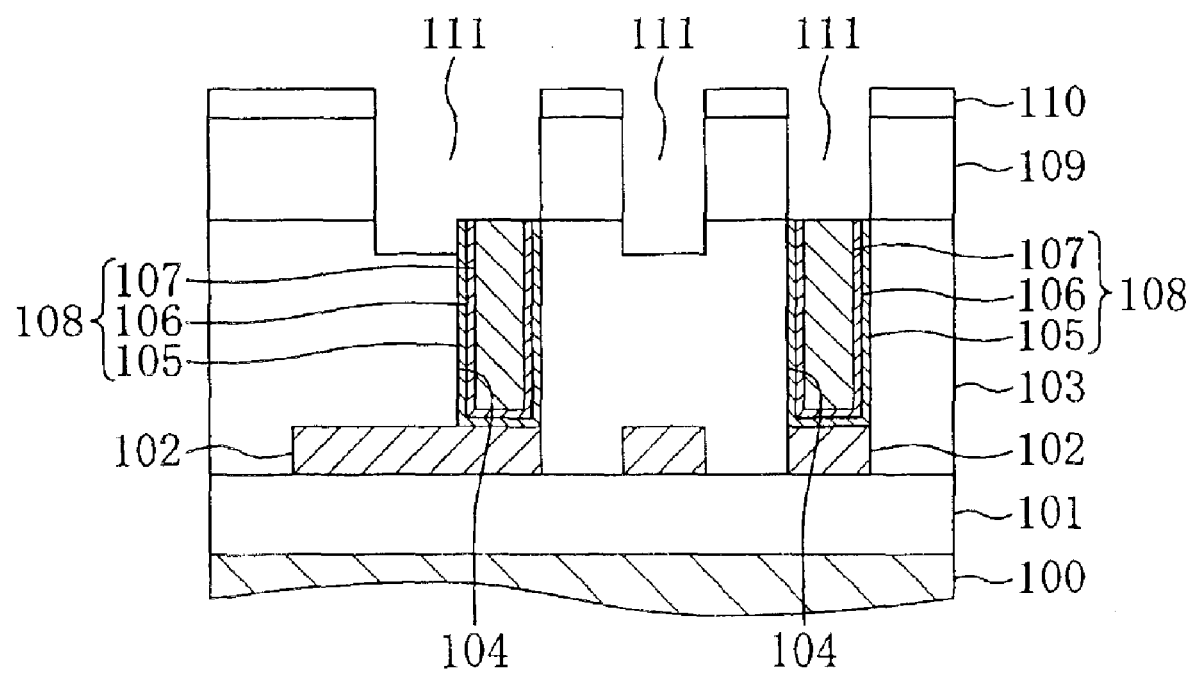

Next, as shown in FIG. 2B, a silicon dioxide film 109 doped with fluorine (hereinafter referred to as an FSG (Fluorine Doped Silicate Glass) film) and an ARL film 110 is deposited successively by, e.g., CVD on the second silicon dioxide film 103. The ARL film 110 has a two-layer structure consisting of, e.g., an upper-layer SiON film and a lower-layer $SiO_2$ film as well as the function of improving resolution during exposure in the subsequent lithographic step. Then, a plurality of wiring grooves (trenches) 111 are formed by lithography and dry etching in the ARL film 110 and in the FSG film 109 (and in the surface portion of the second silicon dioxide film 103). It is to be noted that the plurality of wiring grooves 111 include wiring grooves reaching the plugs 108. The wiring grooves 111 are arranged in, e.g., parallel with each other and the spacing between the wiring grooves 111 is about 0.25 $\mu$m.

Figure 3A:
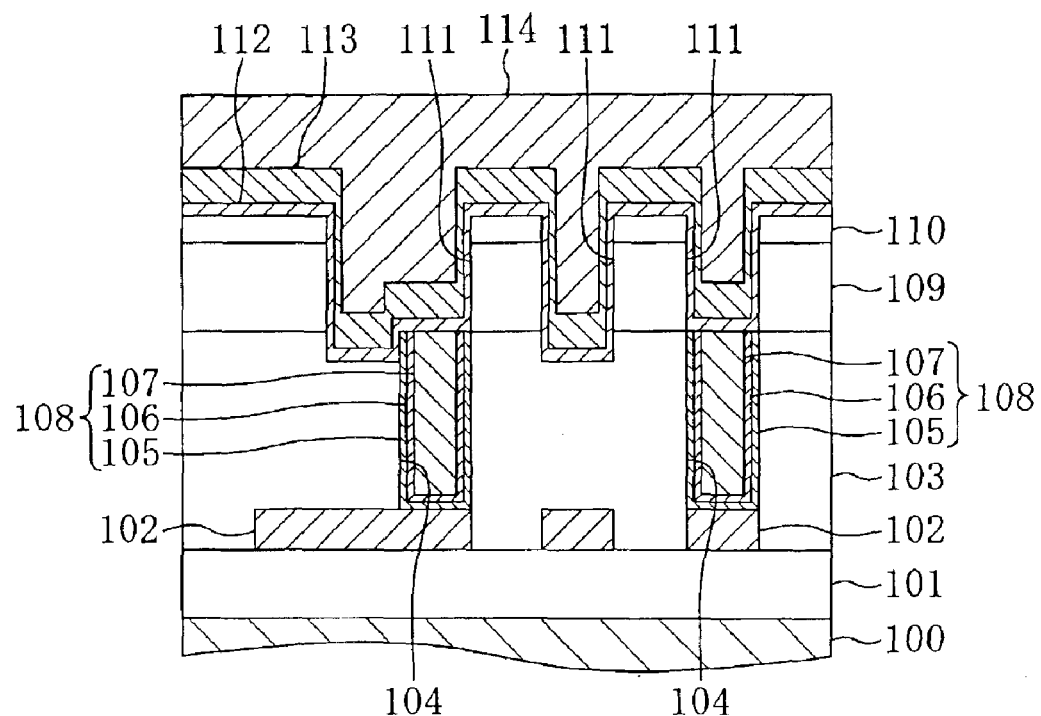
FIGS. 3A and 3B are cross-sectional views illustrating the individual process steps of the method for forming a wiring structure according to the first embodiment.

Next, as shown in FIG. 3A, a tantalum nitride (TaN) film 112 and a first copper (Cu) film 113 are deposited successively by, e.g., PVD over the ARL film 110 such that each of the wiring grooves 111 is filled midway therewith. The first copper film 113 functions herein as a seed layer in the subsequent plating step, while the tantalum nitride film 112 functions as a barrier layer. Subsequently, a second copper film 114 is deposited by, e.g., plating on the first copper film 113 such that each of the wiring grooves 111 is filled completely therewith.

Figure 3B:
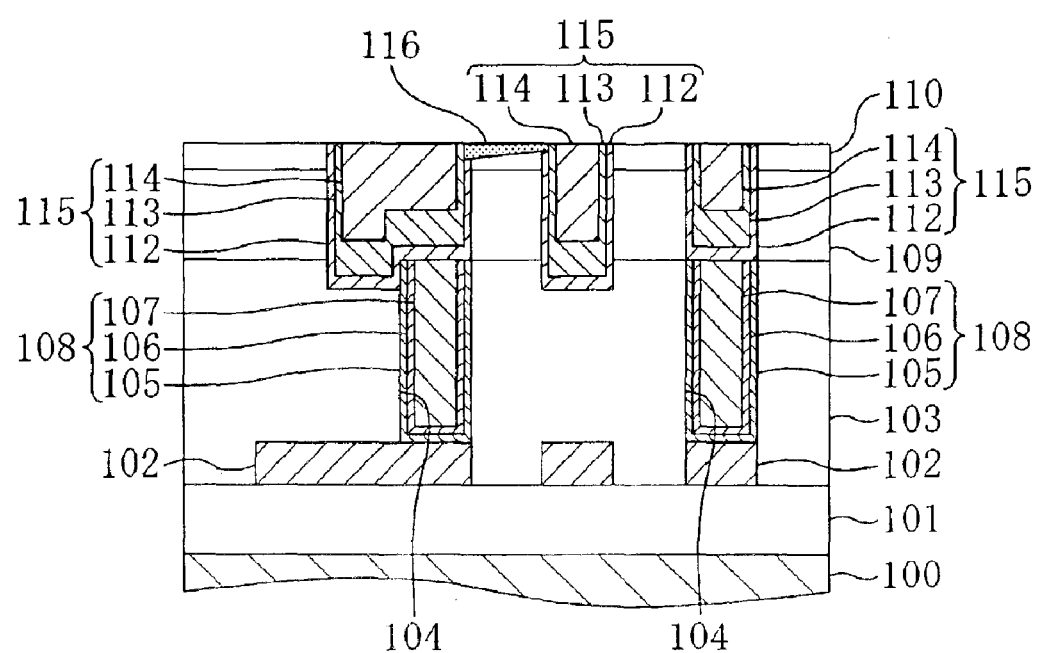

Then, as shown in FIG. 3B, the respective portions of the first and second copper films 113 and 114 deposited on regions outside the wiring grooves 111 are removed by CMP using an abrasive agent (slurry) for polishing Cu (first polishing step). This exposes the portions of the tantalum nitride film 112 outside the wiring grooves 111. Subsequently, the portions of the tantalum nitride film 112 deposited on regions outside the wiring grooves 111 are removed by CMP using a slurry for polishing a barrier layer (TaN) (second polishing step). As a result, copper wires (upper-layer wires) 115 each having a barrier layer between itself and the FSG film 109 are formed in the individual wiring grooves 111 and a surface of the ARL film 110 is exposed. The copper wires 115 are connected electrically to the plugs 108 formed thereunder.

In the present embodiment, each of the first and second polishing steps is performed by using the same CMP system. In a transition from the first polishing step to the second polishing step, polishing conditions including the type of the slurry are changed. Specifically, the pressure under which the substrate 100 is pressed onto the polishing pad and the rotating speed of the polishing pad are lower in the second polishing step than in the first polishing step. If a CMP system which rotates a substrate in conjunction with a substrate holder is used, the rotating speed of a polishing pad indicates the relative velocity of the polishing pad to the substrate in the present specification.

At the end time of the second polishing step performed by CMP using a slurry for polishing TaN, a metal 116 such as copper is buried in a crack formed in the surface of the ARL film 110 between the copper wires 115, as shown in FIG. 3B. If the metal 116 buried in the crack forms a pseudocross-linking structure between the copper wires 115, a short circuit occurs between the copper wires 115 disadvantageously.

To reduce the frequency of short circuits occurring between the copper wires 115, while minimizing a reduction in the thickness of the copper film composing the copper wires 115, the present embodiment removes the metal 116 buried in the crack by using the following method.

Figure 5A:
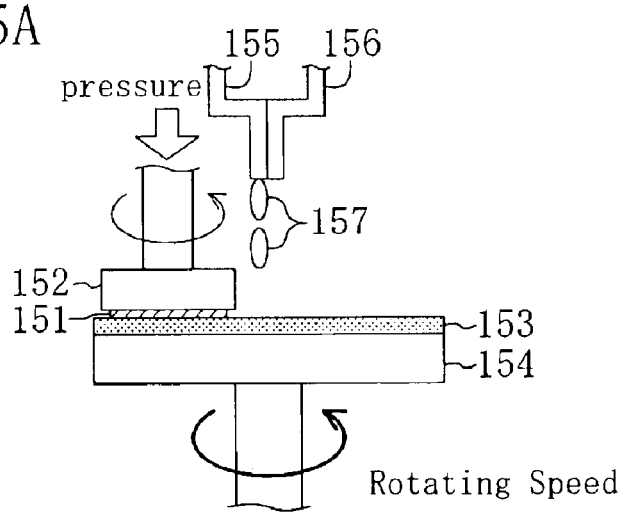
FIGS. 5A, 5B, and 5C illustrate a second polishing step, a foreign matter removing step (cleaning step), and a third polishing step in the method for forming a wiring structure according to the first or second embodiment of the present invention, respectively.
Figure 5B:
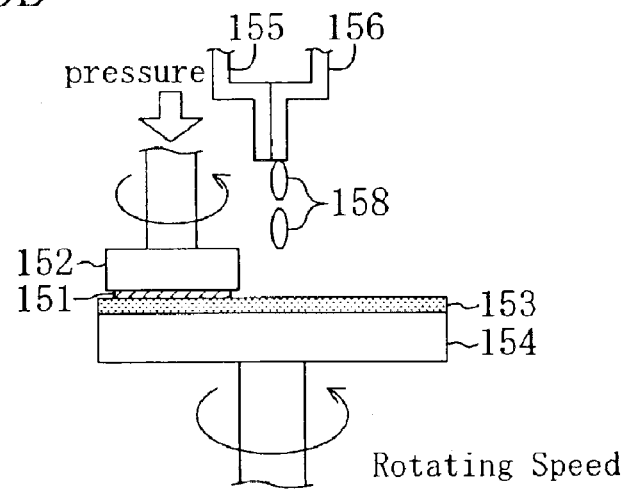
Figure 5C:
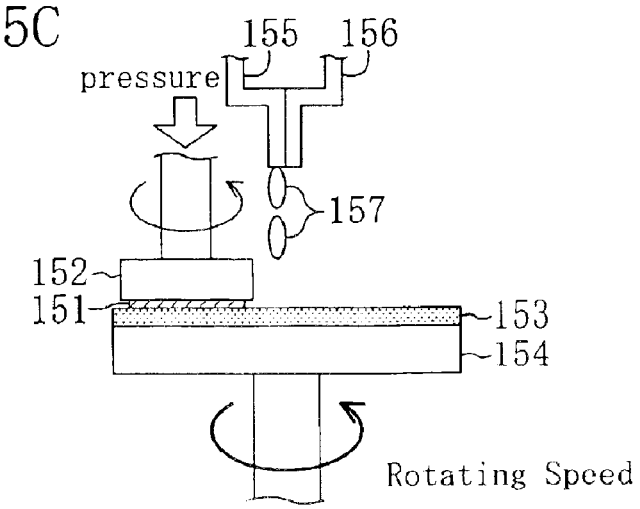
Figure 6:
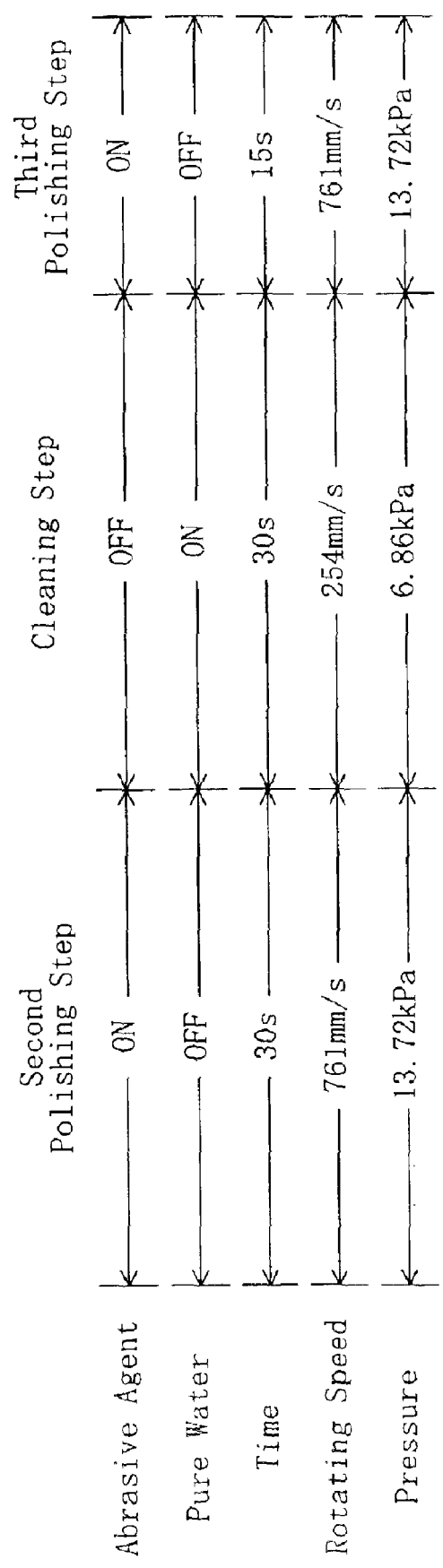
FIG. 6 shows respective polishing conditions for the second polishing step, the foreign matter removing step, and the third polishing step in the method for forming a wiring structure according to the first or second embodiment of the present invention.

FIGS. 5A illustrates a second polishing step, FIG. 5B illustrates a foreign matter removing step (cleaning step) performed subsequently to the second polishing step, and FIG. 5C illustrates a third polishing step performed subsequently to the cleaning step. The three steps illustrated by FIGS. 5A to 5C are performed continuously in the same CMP system, while changing only polishing conditions, without halting the rotation of the polishing pad. FIG. 6 shows respective polishing conditions for the three steps illustrated by FIGS. 5A to 5C. In each of the second and third polishing steps, the slurry for polishing TaN is used as an abrasive agent. A detailed description will be given to each of the steps.

First, in the second polishing step shown in FIG. 5A, the portions of the tantalum nitride film 112 deposited on regions outside the wiring grooves 111 are removed as described above. Specifically, a wafer 151 (the substrate 100 at which the tantalum nitride film 112 is exposed) is held by a holder 152 provided rotatable and vertically movable. The polishing pad 153 for polishing a surface of the wafer 151 has been attached to a surface of a platen 154 which performs a rotating movement. A CMP system used in the present embodiment comprises a slurry supply pipe 155 and a cleaning solution supply pipe 156. In the second polishing step, a slurry 157 for polishing TaN is supplied dropwise from the slurry supply pipe 155 onto the polishing pad 153. If the platen 154 is rotated in this state to rotate the polishing pad 153 and the holder 152 is lowered in level while it is rotated, the wafer 151 held by the holder 152 and the polishing pad 153 rub each other, whereby the surface of the wafer 151 is polished. This removes the portions of the tantalum nitride film 112 deposited on the regions outside the wiring grooves 111.

As shown in FIG. 6, the pressure under which the wafer 151 is pressed onto the polishing pad 153 is reduced to 13.72 kPa in a transition from the first polishing step (polishing step for the copper films 113 and 114) to the second polishing step. The other four polishing conditions are such that the supply of the slurry (abrasive agent) is ON, the supply of the cleaning solution (which is specifically pure water) is OFF, the polishing time is 30 seconds, and the rotating speed of the polishing pad (which is precisely the relative velocity of the polishing pad 153 to the wafer 151) is 761 mm/s.

Next, in the cleaning step shown in FIG. 5B, shavings (foreign matter) produced in the first or second polishing step are washed away from the surface of the substrate 100, while the foreign matter adhered to the polishing pad 153 used in the second polishing step is removed simultaneously. Specifically, the polishing pad 153 is rotated continuously with the wafer 151 (the substrate 100 from which the tantalum nitride film 112 has been removed) being held by the holder 152, while pure water 158 is supplied dropwise from the cleaning solution supply pipe 156 onto the polishing pad 153. This allows simultaneous cleaning of the surface of the wafer 151 and the polishing pad 153. In other words, shavings (foreign matters) adhered to the wafer 151 and to the polishing pad 153 in the first or second polishing step can be washed away simultaneously therefrom without retrieving the wafer 151 from the polishing system. It is important here to remove the shavings as the foreign matters. If the metal 116 buried in the crack in the surface of the ARL film 110 is removed with the shavings left on the wafer 151, i.e., the substrate 100, the shavings may cause new damage to the ARL film 110 or to the copper wires 115. Specifically, even if the metal 116 buried initially in the crack is removed successfully, the copper wires 115 may be damaged (i.e., the copper film composing the copper wires 115 may be thinned) or the metal may be buried in a new crack formed in the ARL film 110. The reason for cleaning the surface of the polishing pad 153 to remove the shavings adhered to the polishing pad 153 therefrom is the same as in the case of cleaning the substrate 100 described above. By removing the shavings remaining on the polishing pad 153 therefrom, new damage to the surface of the ARL film 110 or the like when the metal 116 buried in the crack in the surface of the ARL film 110 on the substrate 100 is removed therefrom by continuously using the polishing pad 153 can be prevented more reliably.

In a transition from the second polishing step shown in FIG. 5A to the cleaning step shown in FIG. 5B, polishing conditions are changed as shown in FIG. 6. Specifically, the supply of the slurry (polishing agent) is turned OFF, the supply of the pure water is turned ON, the rotating speed of the polishing pad 153 (which is precisely the relative velocity of the polishing pad 153 to the wafer 151) is reduced to 254 nm/s corresponding to about ⅓ of the rotating speed in the second polishing step, and the pressure under which the wafer 151 is pressed onto the polishing pad 153 is reduced to 6.86 kPa corresponding to about ½ of the pressure in the second polishing step, while the same polishing time of 30 seconds is maintained. The reason for the setting of the polishing time, i.e., cleaning time in the cleaning step to 30 seconds is that a time period of about 30 seconds is required for the replacement of the slurry remaining on the surface of the polishing pad 153 with the pure water. However, the cleaning time can be reduced by increasing the amount of pure water 158 supplied from the cleaning solution supply pipe 156.

Figure 4:
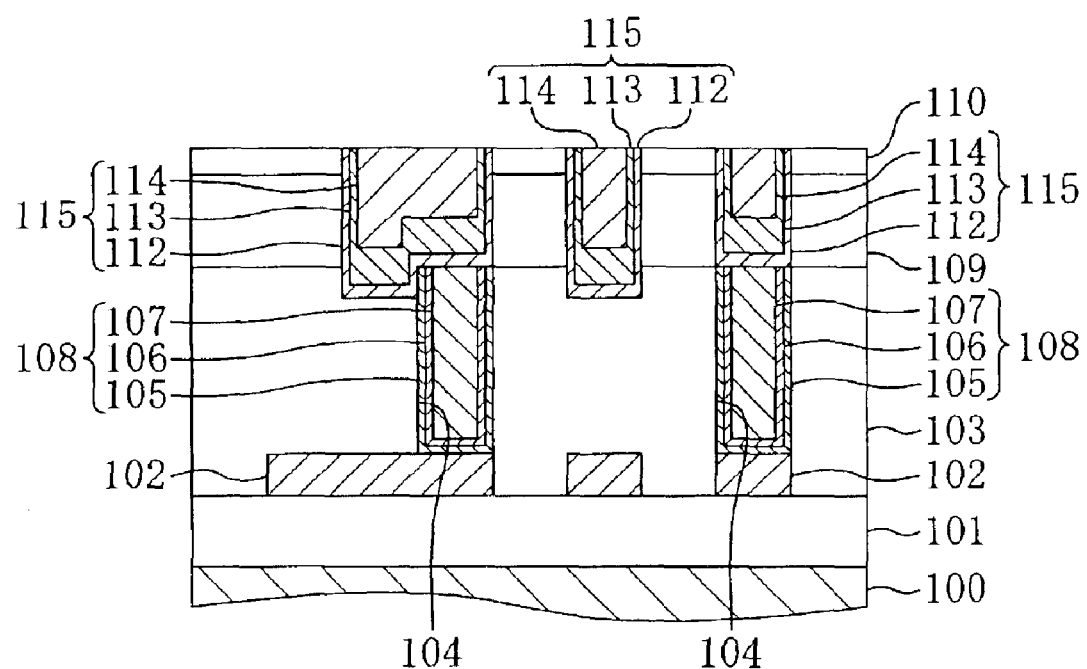
FIG. 4 is a cross-sectional view showing one of the process steps of the method for forming a wiring structure according to the first embodiment.

Next, in the third polishing step shown in FIG. 5C, the surface of the ARL film 110 is polished for the removal of the metal 116 buried in the microcrack in the surface of the ARL film 110. Specifically, the rotation of the polishing pad 153 is maintained with the wafer 151 (the substrate 100 from which the shavings produced in the first or second polishing step has been removed) being held by the holder 152, while the slurry 157 for polishing TaN is supplied dropwise again from the slurry supply pipe 155 onto the polishing pad 153. This polishes the surface of the wafer 151, i.e., the surface of the ARL film 110 and thereby allows the metal 116 in the crack which may cause a short circuit between wires to be removed together with the crack, as shown in FIG. 4.

In a transition from the cleaning step shown in FIG. 5B to the second polishing step shown in FIG. 5C, polishing conditions are changed as shown in FIG. 6. Specifically, the supply of the slurry (abrasive agent) is turned ON, the supply of the pure water is turned OFF, the polishing time is reduced to 15 seconds corresponding to ½ of the polishing time in the cleaning step, the rotating speed (which is precisely the relative velocity of the polishing pad 153 to the wafer 151) of the polishing pad 153 is increased to 761 mm/s which is the same as in the second polishing step, and the pressure under which the wafer 151 is pressed onto the polishing pad 153 is increased to 13.72 kPa which is the same as in the second polishing step. Thus, the polishing conditions for the third polishing step are the same as those for the second polishing step except for the polishing time. This allows properly and sufficiently uniform polishing to be performed with respect to the ARL film 110 so that the metal 116 buried in the surface of the ARL film 110 is removed therefrom. Since copper is hard to polish under the polishing conditions (including the pressure under which the substrate is pressed onto the polishing pad, the rotating speed of the polishing pad, the slurry, and the polishing time) for the third polishing step, the copper film composing the copper wires 115 is prevented from being significantly polished by the third polishing step. This enables reliable removal of the unneeded metal 116 buried in the crack in the fragile ARL film 110 therefrom, while minimizing a reduction in the thickness of a film other than the ARL film 110, e.g., a copper film composing the copper wires 115.

Thus, according to the first embodiment, the barrier metal film (the tantalum nitride film 112) and the wiring conductive films (the copper films 113 and 114) are buried successively in the wiring grooves 111 formed in the FSG film 109 on the substrate 100 and in the ARL film 110 on the FSG film 109 and then the respective portions of the wiring conductive films and the barrier metal film located outside the wiring grooves 111 are removed by polishing. After the foreign matter adhered to the substrate 100 during polishing is then removed, the surface of the ARL film 110 is polished. This achieves the following effects when a microcrack is formed in the surface of the ARL film 110 present between the wiring grooves 111 (i.e., between the copper wires 115) and the metal 116 is buried in the crack during the polishing of the barrier metal film. Since final polishing is performed with respect to the surface of the ARL film 110 after the removal of the foreign matter adhered to the substrate 100 during the polishing of the barrier metal film, it becomes possible to remove the metal 116 buried in the crack therefrom, while preventing new damage caused by the foreign matter to the surface of the ARL film 110. This allows the situation in which the metal 116 buried in the crack causes cross-linking between the copper wires 115 to be circumvented and thereby allows a wiring structure in which the occurrence of short circuits between wires is suppressed, i.e., high-performance wiring to be formed.

Figure 7A:
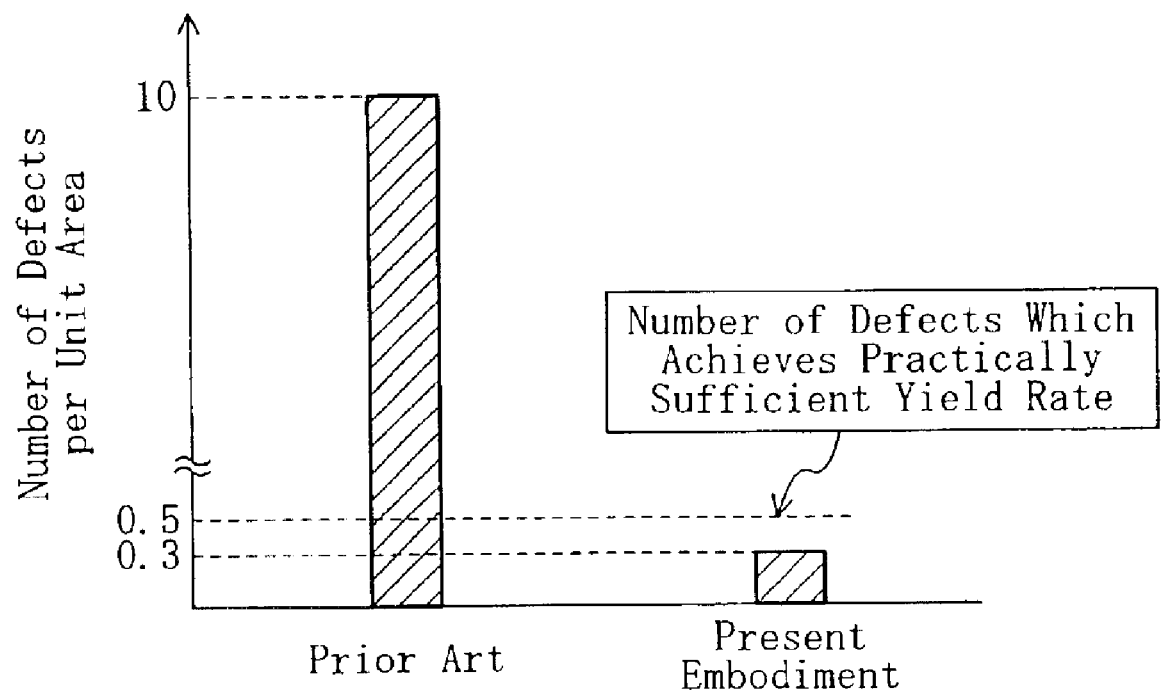
FIG. 7A shows the result of a comparison made between the respective frequencies of short circuits occurred between copper wires formed by the method for forming a wiring structure according to the first embodiment and those formed by the prior art technology and FIG. 7B is a view diagrammatically showing the spacing between wires and the width of each of the wires in a wiring structure formed by the method for forming a wiring structure according to the first embodiment.
Figure 7B:
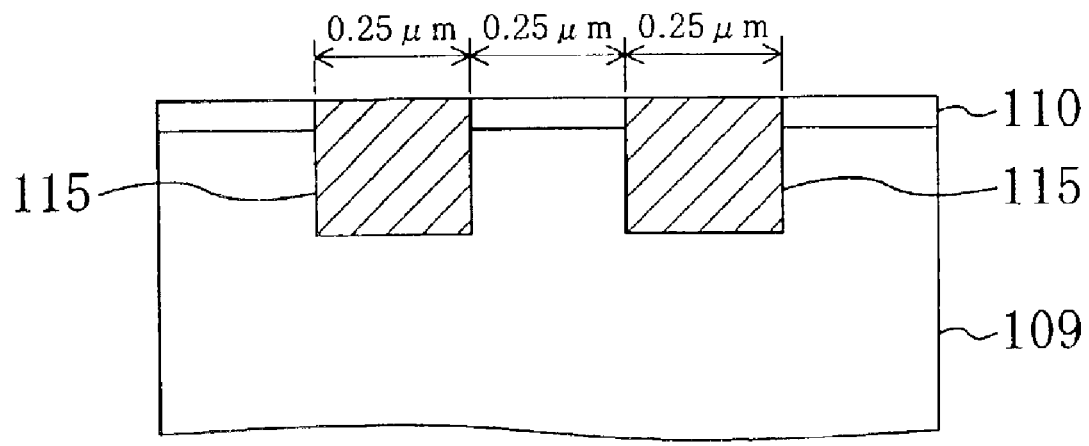

FIG. 7A shows the result of a comparison made between the respective frequencies of short circuits occurred between the copper wires formed by the method for forming a wiring structure according to the present embodiment and those formed by the prior art technology. FIG. 7B diagrammatically shows the spacing between the wires and the width of each of the wires in a wiring structure formed by the method for forming a wiring structure according to the present embodiment. In FIG. 7A, the vertical axis represents the number of defects (the number of scars (cracks) in the surface of the ARL film which may cause short circuits) per unit area (1 cm$^2$). As shown in FIG. 7B, the spacing between the copper wires 115 formed in the FSG film 109 and in the ARL film 110 by the method for forming a wiring structure according to the present embodiment is 0.25 $\mu$m and the width of each of the copper wires 115 is also 0.25 $\mu$m. As shown in FIG. 7A, the present embodiment can reduce the number of defects which may cause short circuits to about 10, which is the number achieved with the prior art technology, to about 0.3 by successively performing the cleaning of the surface of the substrate 100 (removal of shavings) and the polishing of the surface of the ARL film 110 after the polishing of the barrier metal film (tantalum nitride film 112). In other words, the number of defects in the present embodiment is far below 0.5, which is the number of defects that allows a practically sufficient yield rate to be achieved.

With the prior art technology, short circuits between wires began to occur frequently as the spacing between the adjacent wires is reduced, especially when the wire-to-wire spacing becomes 0.25 $\mu$m or less. By contrast, the present embodiment more remarkably achieves the effect of preventing the short circuits between wires when the wire-to-wire spacing is 0.25 $\mu$m or less.

Since the first embodiment performs the removal of the foreign matter adhered to the polishing pad 153 used in the second polishing step (polishing of the tantalum nitride film 112) simultaneously with the removal of the foreign matter adhered to the substrate 100, damage to the surface of the ARL film 110 when the polishing pad 153 is used also in the third polishing step (the polishing of the ARL film 110) is prevented more reliably. Since the respective foreign matters adhered to the substrate 100 (wafer 151) and to the polishing pad 153 are removed simultaneously, the time required to form wiring can be reduced by improving work efficiency.

According to the first embodiment, the second polishing step, the foreign matter removing step (cleaning step), and the third polishing step are performed continuously in the same CMP system without halting the rotation of the polishing pad 153, while changing only the polishing conditions, as shown in FIGS. 5A to 5C. This further improves work efficiency in the formation of wiring. Since the pure water is supplied onto the polishing pad 153 in place of the abrasive agent in the foreign matter removing step, the foreign matters adhered to the wafer 151 (substrate 100) and to the polishing pad 153 can be removed more reliably. Since the rotating speed of the polishing pad 153 and the pressure under which the substrate 100 is pressed onto the polishing pad 153 are lower in the foreign matter removing step than in the second and third polishing steps, it becomes possible to remove the foreign matter adhered to the substrate 100 and to the polishing pad 153 therefrom, while suppressing the scraping-off of the copper film composing the copper wires 115 and the like.

According to the first embodiment, the pressure under which the substrate 100 is pressed onto the polishing pad 153 and the rotating speed of the polishing pad 153 in the third polishing step are the same as in the second polishing step. In other words, the polishing conditions for the third polishing step except for the polishing time are the same as in the second polishing step. This allows easy setting of polishing conditions for the third polishing step. Consequently, work efficiency in the formation of wiring is improved and a reduction in process throughput is prevented. Since the polishing time is shorter in the third polishing step than in the second polishing step, the surface of the ARL film 110 is prevented from being significantly scraped off. If the foregoing pressure and rotation speed are lower in the third polishing step than in the first polishing step (polishing step for the copper films 113 and 114), the significant scraping-off of the surface of the ARL film 110 can be prevented more reliably.

Embodiment 2

Referring to the drawings, a description will be given herein below to a method for forming a wiring structure according to a second embodiment of the present invention. The second embodiment is different from the first embodiment in that it uses a dual damascene method for the formation of copper wires.

FIGS. 8A to 8C and FIGS. 9A and 9B are cross-sectional views illustrating the individual process steps of the method for forming a wiring structure according to the second embodiment.

Figure 8A:
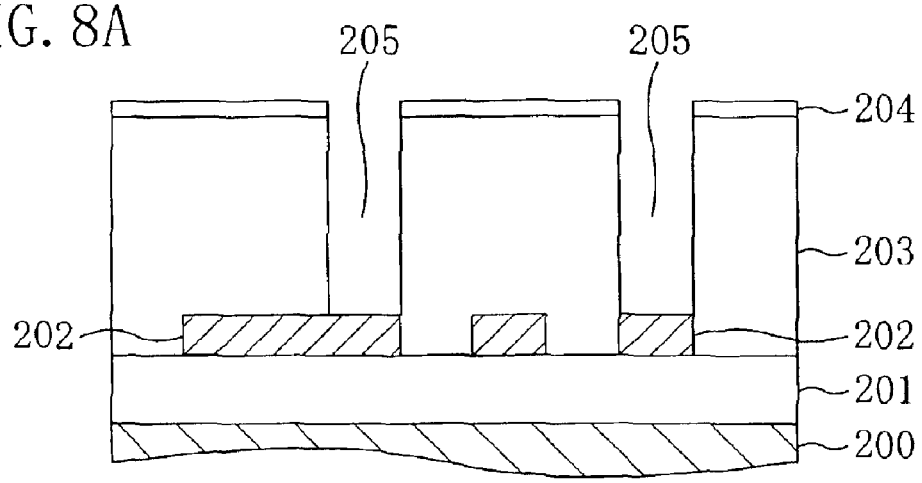
FIGS. 8A to 8C are cross-sectional views illustrating the individual process steps of the method for forming a wiring structure according to the second embodiment of the present invention.

First, as shown in FIG. 8A, a first silicon dioxide film 201 is formed on a substrate 200 composed of, e.g., silicon. Then, lower-layer wires 202 each composed of, e.g., a tungsten film are formed on the first silicon dioxide film 201. Thereafter, a second silicon dioxide film 203 and an ARL film 204 are deposited successively by, e.g., CVD over the upper surface of the first silicon dioxide film 201 including the upper surfaces of the lower-layer wires 202. The ARL film 204 has a two-layer structure consisting of, e.g., an upper-layer SiON film and a lower-layer $SiO_2$ film as well as the function of improving resolution during exposure in the subsequent lithographic step. Thereafter, via holes 205 reaching the lower-layer wires 202 are formed by lithography and dry etching in the ARL film 204 and in the second silicon dioxide film 203.

Figure 8B:
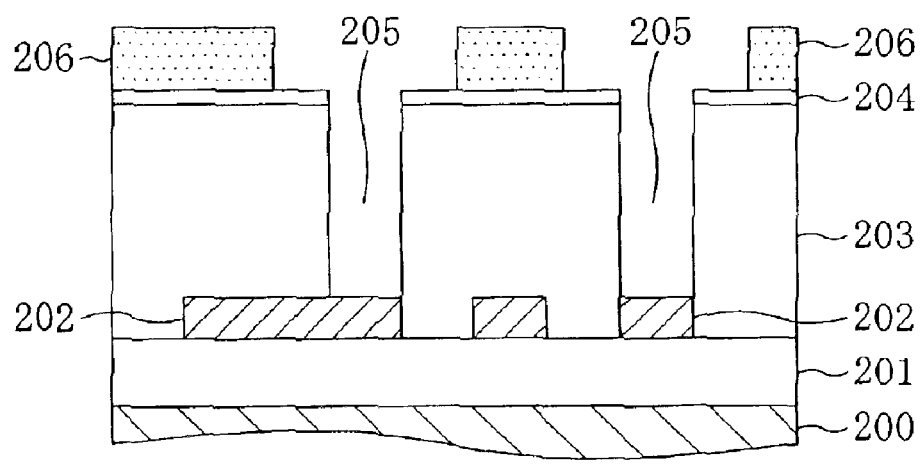

Next, as shown in FIG. 8B, a resist is coated on the entire surface of the substrate 200. Then, a resist pattern 206 having openings corresponding to regions to be formed with wiring grooves is formed by lithography.

Figure 8C:
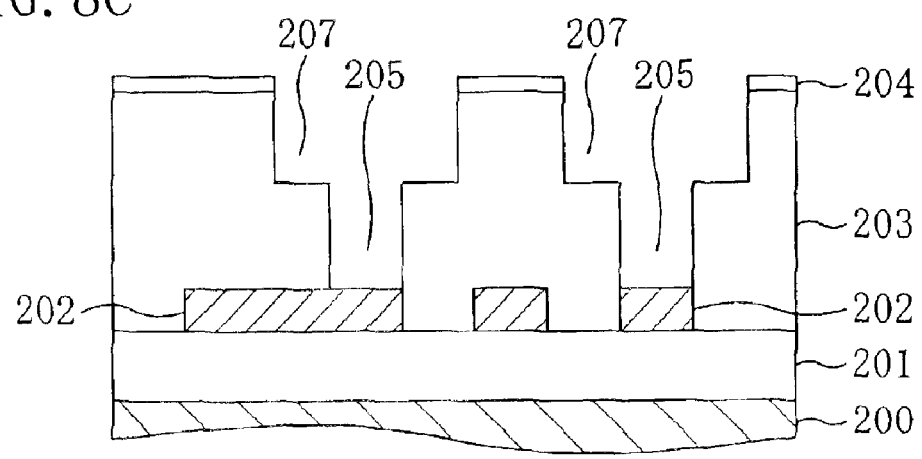

Next, as shown in FIG. 8C, dry etching is performed with respect to the ARL film 204 and to the second silicon dioxide film 203 by using the resist pattern 206 as a mask, thereby forming a plurality of wiring grooves 207. Then, the resist pattern 206 is removed by ashing. It is to be noted that the plurality of wiring grooves 207 include wiring grooves (formed in regions containing the upper portions of the original via holes 205) reaching the via holes 205. The wiring grooves 207 are arranged in, e.g., parallel with each other. The spacing between the wiring grooves 207 is about 0.25 µm.

Figure 9A:
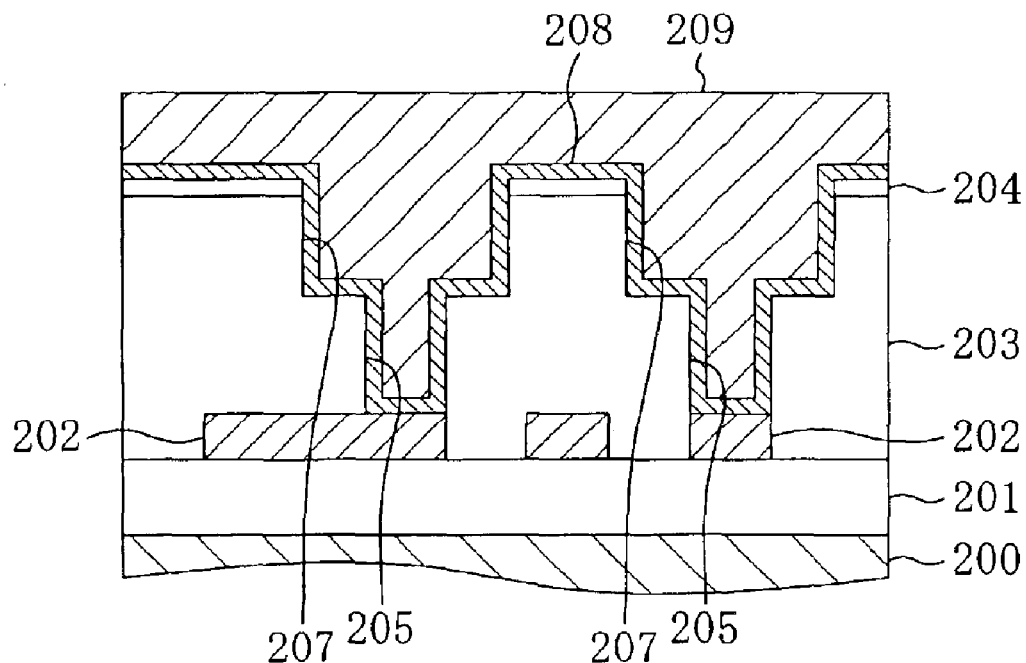
FIGS. 9A and 9B are cross-sectional views illustrating the individual process steps of the method for forming a wiring structure according to the second embodiment.

Next, as shown in FIG. 9A, a tantalum nitride (TaN) film 208 is deposited on the ARL film 204 such that each of the wiring grooves 207 and the via holes 205 is filled midway therewith. The tantalum nitride film 208 functions as a barrier layer. Subsequently, a copper film 209 is deposited on the tantalum nitride film 208 such that each of the wiring grooves 207 and the via holes 205 is filled completely therewith.

Figure 9B:
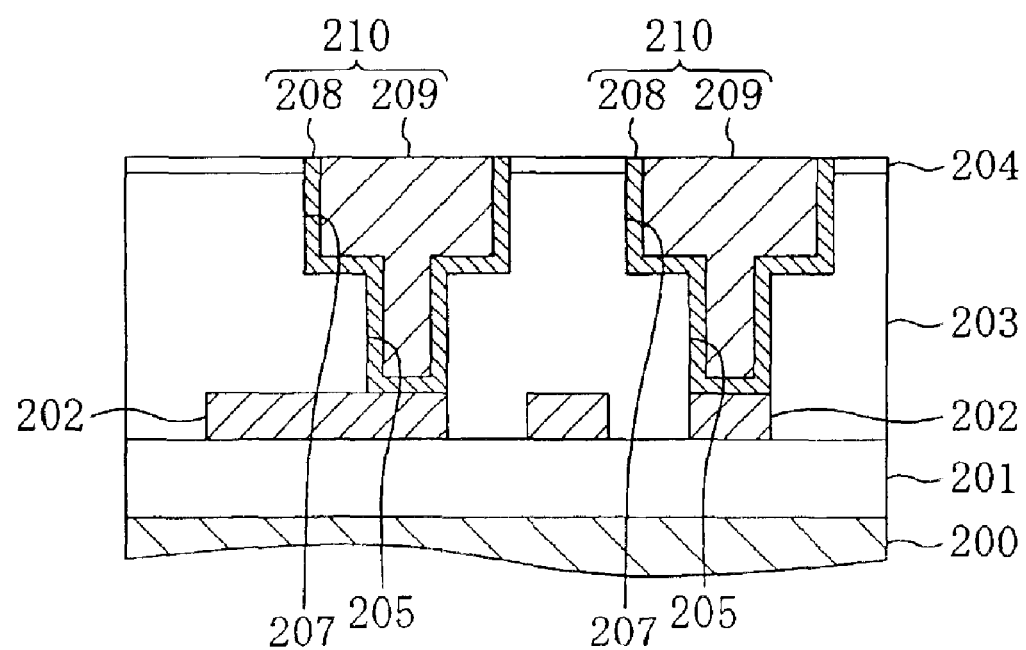
Figure 10A:
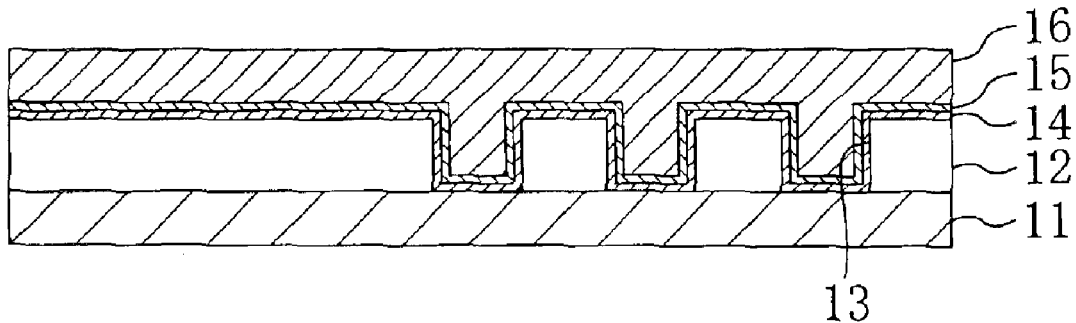
FIGS. 10A to 10C are cross-sectional views illustrating the individual process steps of a conventional method for forming a wiring structure.
Figure 10B:
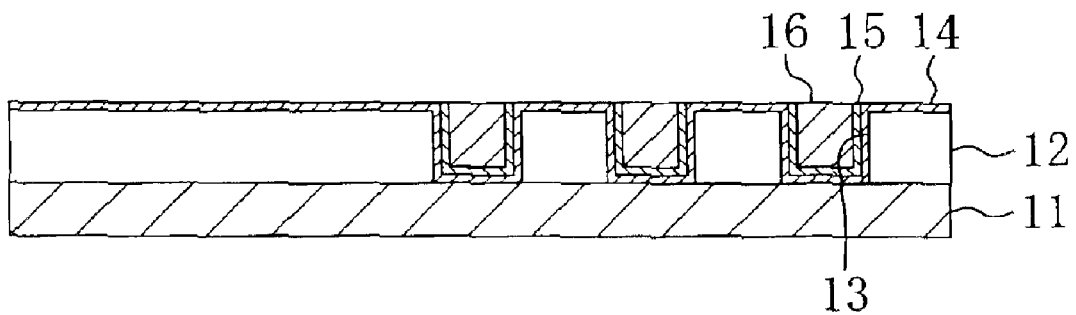
Figure 10C:
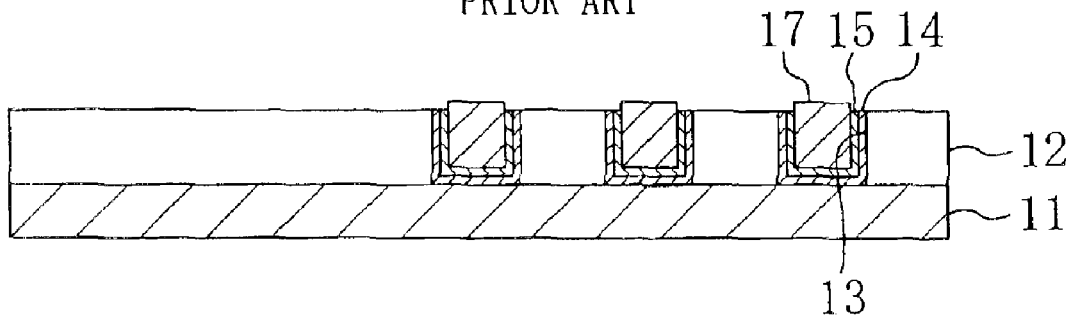
Figure 11:
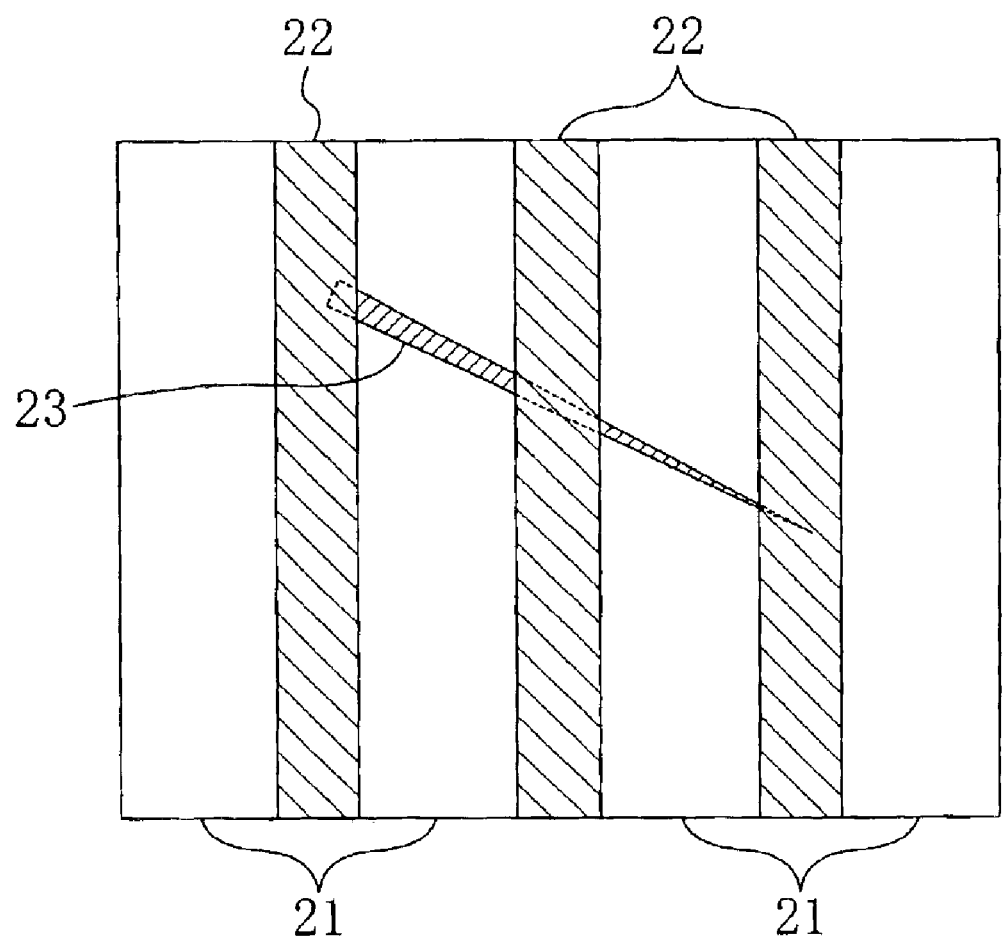
FIG. 11 is a view for illustrating the problem of the conventional method for forming a wiring structure.

Next, as shown in FIG. 9B, the portions of the copper film 209 deposited on regions outside the wiring grooves 207 and the via holes 205 are removed by CMP using a slurry for polishing Cu (first polishing step). This exposes the portions of the tantalum nitride film 208 located outside the wiring grooves 207 and the via holes 205. Subsequently, the portions of the tantalum nitride film 208 deposited on regions outside the wiring grooves 207 and the via holes 205 are removed by CMP using a slurry for polishing the barrier layer (TaN) (second polishing step). As a result, copper wires (upper-layer wires) 210 each having a barrier layer between itself and an insulating film such as the second silicon dioxide film 203 are formed in the individual wiring grooves 207 and in the individual via holes 205 and a surface of the ARL film 204 is exposed. The copper wires 210 have plug portions formed in the via holes 205 and connected electrically to the lower wires 202.

In the present embodiment, each of the first and second polishing steps is performed by using the same CMP system in the same manner as in the first embodiment. In a transition from the first polishing step to the second polishing step, polishing conditions including the type of the slurry are changed. Specifically, the pressure under which the substrate 200 is pressed onto the polishing pad and the rotating speed of the polishing pad are lower in the second polishing step than in the first polishing step.

At the end time of the second polishing step performed by using CMP as described above, a metal such as copper (not shown) is buried in a crack formed in the surface of the ARL film 204 between the copper wires 210. If the metal buried in the crack forms a pseudocross-linking structure between the copper wires 210, a short circuit occurs between the copper wires 210 disadvantageously.

To reduce the frequency of short circuits occurring between the copper wires 210, while minimizing a reduction in the thickness of the copper film composing the copper wires 210, the present embodiment removes the metal buried in the crack by using the following method.

FIGS. 5A illustrates a second polishing step, FIG. 5B illustrates a foreign matter removing step (cleaning step) performed subsequently to the second polishing step, and FIG. 5C illustrates a third polishing step performed subsequently to the cleaning step. The three steps illustrated by FIGS. 5A to 5C are performed continuously in the same CMP system, while changing only polishing conditions, without halting the rotation of the polishing pad. FIG. 6 shows respective polishing conditions for the three steps illustrated by FIGS. 5A to 5C. In each of the second and third polishing steps, the slurry for polishing TaN is used as an abrasive agent. A detailed description will be given to each of the steps.

First, in the second polishing step shown in FIG. 5A, the portions of the tantalum nitride film 208 deposited on regions outside the wiring grooves 207 and the via holes 205 are removed as described above. Specifically, a wafer 151 (the substrate 200 at which the tantalum nitride film 208 is exposed) is held by a holder 152 provided rotatable and vertically movable. The polishing pad 153 for polishing a surface of the wafer 151 has been attached to a surface of a platen 154 which performs a rotating movement. A CMP system used in the present embodiment comprises a slurry supply pipe 155 and a cleaning solution supply pipe 156. In the second polishing step, a slurry 157 for polishing TaN is supplied dropwise from the slurry supply pipe 155 onto the polishing pad 153. If the platen 154 is rotated in this state to rotate the polishing pad 153 and the holder 152 is lowered in level while it is rotated, the wafer 151 held by the holder 152 and the polishing pad 153 rub each other, whereby the surface of the wafer 151 is polished. This removes the portions of the tantalum nitride film 208 deposited on the regions outside the wiring grooves 207 and the via holes 205.

As shown in FIG. 6, the pressure under which the wafer 151 is pressed onto the polishing pad 153 is reduced to 13.72 kPa in a transition from the first polishing step (polishing step for the copper film 209) to the second polishing step. The other four polishing conditions are such that the supply of the slurry (abrasive agent) is ON, the supply of the cleaning solution (which is specifically pure water) is OFF, the polishing time is 30 seconds, and the rotating speed of the polishing pad (which is precisely the relative velocity of the polishing pad 153 to the wafer 151) is 761 mm/s.

Next, in the cleaning step shown in FIG. 5B, shavings (foreign matter) produced in the first or second polishing step are washed away from the surface of the substrate 200, while the foreign matter adhered to the polishing pad 153 used in the second polishing step is removed simultaneously. Specifically, the polishing pad 153 is rotated continuously with the wafer 151 (the substrate 200 from which the tantalum nitride film 208 has been removed) being held by the holder 152, while pure water 158 is supplied dropwise from the cleaning solution supply pipe 156 onto the polishing pad 153. This allows simultaneous cleaning of the surface of the wafer 151 and the polishing pad 153. In other words, shavings (foreign matters) adhered to the wafer 151 and to the polishing pad 153 in the first or second polishing step can be washed away simultaneously therefrom without retrieving the wafer 151 from the polishing system. It is important here to remove the shavings as the foreign matters. If the metal buried in the crack in the surface of the ARL film 110 is removed with the shavings left on the wafer 151, i.e., the substrate 200, the shavings may cause new damage to the ARL film 204 or to the copper wires 210. Specifically, even if the metal buried initially in the crack is removed successfully, the copper wires 210 may be damaged (i.e., the copper film composing the copper wires 210 may be thinned) or the metal may be buried in a new crack formed in the ARL film 204. The reason for cleaning the surface of the polishing pad 153 to remove the shavings adhered to the polishing pad 153 therefrom is the same as in the case of cleaning the substrate 200 described above. By removing the shavings remaining on the polishing pad 153 therefrom, new damage to the surface of the ARL film 204 or the like when the metal buried in the crack in the surface of the ARL film 204 on the substrate 200 is removed therefrom by continuously using the polishing pad 153 can be prevented more reliably.

In a transition from the second polishing step shown in FIG. 5A to the cleaning step shown in FIG. 5B, polishing conditions are changed as shown in FIG. 6. Specifically, the supply of the slurry (polishing agent) is turned OFF, the supply of the pure water is turned ON, the rotating speed of the polishing pad 153 (which is precisely the relative velocity of the polishing pad 153 to the wafer 151) is reduced to 254 nm/s corresponding to about ⅓ of the rotating speed in the second polishing step, and the pressure under which the wafer 151 is pressed onto the polishing pad 153 is reduced to 6.86 kPa corresponding to about ½ of the pressure in the second polishing step, while the same polishing time of 30 seconds is maintained. The reason for the setting of the polishing time, i.e., cleaning time in the cleaning step to 30 seconds is that a time period of about 30 seconds is required for the replacement of the slurry remaining on the surface of the polishing pad 153 with the pure water. However, the cleaning time can be reduced by increasing the amount of pure water 158 supplied from the cleaning solution supply pipe 156.

Next, in the third polishing step shown in FIG. 5C, the surface of the ARL film 204 is polished for the removal of the metal buried in the microcrack in the surface of the ARL film 204. Specifically, the rotation of the polishing pad 153 is maintained with the wafer 151 (the substrate 200 from which the shavings produced in the first or second polishing step has been removed) being held by the holder 152, while the slurry 157 for polishing TaN is supplied dropwise again from the slurry supply pipe 155 onto the polishing pad 153. This polishes the surface of the wafer 151, i.e., the surface of the ARL film 204 and thereby allows the metal in the crack which may cause a short circuit between wires to be removed together with the crack.

In a transition from the cleaning step shown in FIG. 5B to the second polishing step shown in FIG. 5C, polishing conditions are changed as shown in FIG. 6. Specifically, the supply of the slurry (abrasive agent) is turned ON, the supply of the pure water is turned OFF, the polishing time is reduced to 15 seconds corresponding to ½ of the polishing time in the cleaning step, the rotating speed (which is precisely the relative velocity of the polishing pad 153 to the wafer 151) of the polishing pad 153 is increased to 761 mm/s which is the same as in the second polishing step, and the pressure under which the wafer 151 is pressed onto the polishing pad 153 is increased to 13.72 kPa which is the same as in the second polishing step. Thus, the polishing conditions for the third polishing step are the same as those for the second polishing step except for the polishing time. This allows properly and sufficiently uniform polishing to be performed with respect to the ARL film 204 so that the metal buried in the surface of the ARL film 204 is removed therefrom. Since copper is hard to polish under the polishing conditions (including the pressure under which the substrate is pressed onto the polishing pad, the rotating speed of the polishing pad, the slurry, and the polishing time) for the third polishing step, the copper film composing the copper wires 210 is prevented from being significantly polished by the third polishing step. This enables reliable removal of the unneeded metal buried in the crack in the fragile ARL film 204 therefrom, while minimizing a reduction in the thickness of a film other than the ARL film 204, e.g., a copper film composing the copper wires 210.

Thus, according to the second embodiment, the barrier metal film (the tantalum nitride film 208) and the wiring conductive film (the copper film 209) are buried successively in the wiring grooves 207 and the via holes 205 each formed in the ARL film 204 on the substrate 200 and in the second silicon dioxide film 203 and then the respective portions of the wiring conductive film and the barrier metal film located outside the wiring grooves 207 and the via holes 205 are removed by polishing: After the foreign matter (shavings) adhered to the substrate 200 during polishing is then removed, the surface of the ARL film 204 is polished. This achieves the following effects when a microcrack is formed in the surface of the ARL film 204 present between the wiring grooves 207 (i.e., between the copper wires 210) and the metal is buried in the crack during the polishing of the barrier metal film. Since final polishing is performed with respect to the surface of the ARL film 204 after the removal of the foreign matter adhered to the substrate 200 during the polishing of the barrier metal film, it becomes possible to remove the metal buried in the crack therefrom, while preventing new damage caused by the foreign matter to the surface of the ARL film 204. This allows the situation in which the metal buried in the crack causes cross-linking between the copper wires 210 to be circumvented and thereby allows a wiring structure in which the occurrence of short circuits between wires is suppressed, i.e., high-performance wiring to be formed.

With the prior art technology, short circuits between wires began to occur frequently as the spacing between the adjacent wires is reduced, especially when the wire-to-wire spacing becomes 0.25 $\mu$m or less. By contrast, the present embodiment more remarkably achieves the effect of preventing the short circuits between wires when the wire-to-wire spacing is 0.25 $\mu$m or less.

Since the second embodiment performs the removal of the foreign matter adhered to the polishing pad 153 used in the second polishing step (polishing of the tantalum nitride film 208) simultaneously with the removal of the foreign matter adhered to the substrate 200, damage to the surface of the ARL film 204 when the polishing pad 153 is used also in the third polishing step (the polishing of the ARL film 204) is prevented more reliably. Since the respective foreign matters adhered to the substrate 200 (wafer 151) and to the polishing pad 153 are removed simultaneously, the time required to form wiring can be reduced by improving work efficiency.

According to the second embodiment, the second polishing step, the foreign matter removing step (cleaning step), and the third polishing step are performed continuously in the same CMP system without halting the rotation of the polishing pad 153, while changing only the polishing conditions, as shown in FIGS. 5A to 5C. This further improves work efficiency in the formation of wiring. Since the pure water is supplied onto the polishing pad 153 in place of the abrasive agent in the foreign matter removing step, the foreign matters adhered to the wafer 151 (substrate 200) and to the polishing pad 153 can be removed more reliably. Since the rotating speed of the polishing pad 153 and the pressure under which the substrate 200 is pressed onto the polishing pad 153 are lower in the foreign matter removing step than in the second and third polishing steps, it becomes possible to remove the foreign matter adhered to the substrate 200 and to the polishing pad 153 therefrom, while suppressing the scraping-off of the copper film composing the copper wires 210 and the like.

According to the second embodiment, the pressure under which the substrate 200 is pressed onto the polishing pad 153 and the rotating speed of the polishing pad 153 in the third polishing step are the same as in the second polishing step. In other words, the polishing conditions for the third polishing step except for the polishing time are the same as in the second polishing step. This allows easy setting of polishing conditions for the third polishing step. Consequently, work efficiency in the formation of wiring is improved and a reduction in process throughput is prevented. Since the polishing time is shorter in the third polishing step than in the second polishing step, the surface of the ARL film 204 is prevented from being significantly scraped off. If the foregoing pressure and rotation speed are lower in the third polishing step than in the first polishing step (polishing step for the copper film 209), the significant scraping-off of the surface of the ARL film 204 can be prevented more reliably.

Although the first or second embodiment has described the case where the first-layer copper wires are formed by using the ARL film, the method according to the present embodiment may also be applied to the formation of upper-layer copper wires in the second and higher-level layers when multilayer copper wiring is formed by using an ARL film. The method according to the present embodiment may also be applied to the case where wires are formed by burying a conductive film other than a copper film in the wiring grooves.

In the first or second embodiment, the type of the barrier metal film is not particularly limited. If a copper film is used as a wiring conductive film, e.g., a tantalum film, a tantalum nitride film, or a multilayer film composed of a tantalum film and a tantalum nitride film is used preferably. The types of an insulating film and an ARL film in each of which wires are buried are not particularly limited, either.

Preferably, the first or second embodiment performs the cleaning of the substrate and the polishing pad by using pure water, an organic acid solution, or an organic alkaline solution in the foreign matter removing step (cleaning step) performed after the second polishing step (polishing of the barrier metal film). This ensures the removal of a foreign matter (residual shavings) adhered to the surface of the substrate and to the polishing pad. As the organic alkali used in this step, a hydroxylamine such as TMAH (tetramethylammonium hydride) may also be used. As the organic acid used in this step, a carboxylic acid having two or more carboxyl groups (—COOH groups) such as an oxalic acid, a citric acid, or a malic acid may also be used.

In the first or second embodiment, the type of the slurry for polishing Cu and the type of the slurry for polishing the barrier layer (TaN) are not particularly limited. A slurry for polishing Cu containing, e.g., an aqueous hydrogen peroxide as an oxidizing agent, a slurry for polishing TaN containing, e.g., a nitric acid (or a derivative compound thereof) as an oxidizing agent, and the like may also be used. Alternatively, a slurry for polishing Cu and a slurry for polishing TaN having mutually different particles sizes may also be used. Although the type of the slurry used in the third polishing step is not particularly limited, a slurry for polishing the barrier layer is used preferably in the same manner as in the second polishing step. This prevents the wiring conductive film from being significantly polished in the third polishing step so that an increase in wiring resistance is prevented. This also allows easier changes made to the polishing conditions in a transition from the second polishing step to the third polishing step.

Although the first or second embodiment has performed each of the first to third polishing steps and the foreign matter removing step by using the same CMP system, it is also possible to perform the polishing steps other than the second polishing step and the foreign matter removing step by using another CMP system instead. A CMP system that can be used in the first to third polishing steps and the foreign matter removing step is not limited to a scheme having one substrate holder such that a single substrate is polished in one polishing step. It is also possible to use a CMP system having a plurality of substrate holders such that a plurality of substrates are polished in one polishing step.

What is claimed is:

1. A method for forming a wiring structure, the method comprising:
    a groove forming step of forming an anti-reflection film on an insulating film and then forming, in each of the anti-reflection film and the insulating film, a first groove and a second groove adjacent to the first groove;
    a film depositing step of depositing a barrier metal film and a conductive film on the anti-reflection film such that each of the first and second grooves is filled therewith;
    a first polishing step of removing the portion of the conductive film outside the first and second grooves by polishing;
    a second polishing step of removing, after the first polishing step, the portion of the barrier metal film outside the first and second grooves by polishing;
    a foreign matter removing step of removing respective foreign matters adhered to a polishing pad and to a surface to be polished after the second polishing step therefrom; and
    a third polishing step of polishing, after the foreign matter removing step, a surface of the anti-reflection film.

2. The method of claim 1, wherein
    a pressure under which the surface to be polished is pressed onto a polishing pad and a rotating speed of the polishing pad in the third polishing step are the same as in the second polishing step.

3. The method of claim 2, wherein
    a polishing time is shorter in the third polishing step than in the second polishing step.

4. The method of claim 2, wherein the pressure and the rotating speed are lower in the third polishing step than in the first polishing step.

5. The method of claim 1, wherein an abrasive agent used in the third polishing step is the same as used in the second polishing step.

6. The method of claim 1, wherein
    each of the second polishing step, the foreign matter removing step, and the third polishing step is performed by using the same polishing system and
    the foreign matter removing step includes the step of rotating a polishing pad with the surface to be polished being pressed onto the polishing pad.

7. The method of claim 6, wherein the foreign matter removing step includes the step of supplying an organic acid, an organic alkali, or pure water onto the polishing pad in place of an abrasive agent.

8. The method of claim 6, wherein a rotating speed of the polishing pad is lower in the foreign matter removing step than in each of the second and third polishing steps.

9. The method of claim 6, wherein a pressure under which the surface to be polished is pressed onto the polishing pad is lower in the foreign matter removing step than in each of the second and third polishing steps.

10. The method of claim 1, wherein a spacing between the first and second grooves is 0.25 $\mu$m or less.

11. The method of claim 1, wherein the first and second grooves are arranged in parallel with each other.

12. The method of claim 1, wherein formation of wires in the first and second grooves is performed by a dual damascene method.

13. The method of claim 1, wherein the anti-reflection film is composed of a silicon containing material.

14. The method of claim 1, wherein
the conductive film is a copper film and
the barrier metal film is a tantalum film, a tantalum nitride film, or a multilayer film composed of a tantalum film and a tantalum nitride film.

15. The method of claim 14, wherein a wire formed in the first or second groove is connected electrically to a plug formed under the wire.

* * * * *